United States Patent [19]

Kashida et al.

[11] Patent Number: 5,209,996

[45] Date of Patent: May 11, 1993

[54] MEMBRANE CONSISTING OF SILICON CARBIDE AND SILICON NITRIDE, METHOD FOR THE PREPARATION THEREOF AND MASK FOR X-RAY LITHOGRAPHY UTILIZING THE SAME

[75] Inventors: Meguru Kashida; Yoshihiro Kubota; Yoshihiko Nagata, all of Gunma, Japan

[73] Assignee: Shin-Etsu Chemical Co., Ltd., Tokyo, Japan

[21] Appl. No.: 850,691

[22] Filed: Mar. 11, 1992

Related U.S. Application Data

[63] Continuation-in-part of Ser. No. 555,722, Jul. 19, 1990, abandoned.

[30] Foreign Application Priority Data

Jul. 26, 1989 [JP] Japan .................................. 1-192977

[51] Int. Cl.$^5$ .............................................. G03F 9/00
[52] U.S. Cl. ........................................ 430/5; 430/966; 378/34; 378/35; 428/446; 428/698; 501/92; 156/659.1; 156/657; 204/192.1
[58] Field of Search ........................ 430/5, 966; 378/34, 378/35; 428/446, 698; 501/92; 156/659.1, 657; 204/192.1

[56] References Cited

U.S. PATENT DOCUMENTS

| | | | |
|---|---|---|---|
| 4,560,668 | 12/1985 | Hunold et al. ................... | 501/92 |
| 4,608,326 | 8/1986 | Neukermans et al. ............ | 430/5 |
| 4,690,790 | 9/1987 | Bates ................................ | 501/92 |
| 4,862,490 | 8/1989 | Karnezos et al. ................. | 378/35 |
| 4,971,851 | 11/1990 | Neukermans et al. ........... | 428/698 |
| 4,998,267 | 5/1991 | Lee et al. .......................... | 430/5 |
| 5,005,075 | 4/1991 | Kobayashi et al. ............... | 430/5 |
| 5,093,056 | 3/1992 | Miyamoto et al. ............... | 501/92 |
| 5,098,515 | 3/1992 | Kashida et al. ................... | 378/35 |
| 5,101,420 | 3/1992 | Kushibiki et al. ................ | 430/5 |

FOREIGN PATENT DOCUMENTS

| | | | |
|---|---|---|---|
| 1024535 | 1/1978 | Canada ............................. | 501/92 |
| 0078010 | 5/1983 | European Pat. Off. .......... | 501/92 |
| 6104779 | 8/1981 | Japan ................................ | 501/92 |
| 2066800 | 7/1981 | United Kingdom ............. | 501/92 |

OTHER PUBLICATIONS

Neufeldt, V. and Guralink, D., "Webster's New World Dictionary", 1988, Webster's New World, p. 646 and p. 286.

*Primary Examiner*—Charles L. Bowers, Jr.
*Assistant Examiner*—Thomas R. Neville
*Attorney, Agent, or Firm*—McAulay Fisher Nissen Goldberg & Kiel

[57] ABSTRACT

An X-ray transmitting homogeneous membrane suitable for use in a mask for X-ray lithography is disclosed which compositely consists of silicon carbide and silicon nitride in a specified molar proportion. The membrane can be prepared by depositing a film of a homogeneous composite of silicon carbide and silicon nitride on a silicon wafer as a substrate by sputering using a target which is also a sintered composite material of silicon carbide and silicon nitride. As compared with membranes of silicon carbide alone or silicon nitride alone, the inventive membrane is advantageous in respect of the high resistance against high-energy irradiation, chemicals and moisture as well as in respect of high visible-light transmission, especially, when the tensile stress within the membrane is in a specified range.

1 Claim, No Drawings

MEMBRANE CONSISTING OF SILICON CARBIDE AND SILICON NITRIDE, METHOD FOR THE PREPARATION THEREOF AND MASK FOR X-RAY LITHOGRAPHY UTILIZING THE SAME

BACKGROUND OF THE INVENTION

This is a continuation-in-part application from a co-pending U.S. patent application Ser. No. 07/555,722 filed Jul. 19, 1990, the contents of which are hereby incorporated by reference, now abandoned.

The present invention relates to a membrane consisting of silicon carbide SiC and silicon nitride $Si_3N_4$ or, more particularly, to a membrane consisting of silicon carbide SiC and silicon nitride $Si_3N_4$ with a smooth surface free from defects and pinholes having a high visible-light transmission and excellent resistance against high-energy radiation, chemicals and moisture and a method for the preparation thereof as well as a mask for X-ray lithography having such a membrane as the X-ray transmitting membrane.

It is a recent trend in the semiconductor industry that the lithographic process in the manufacture of semiconductor devices is conducted using X-rays as the patterning radiation through a mask for the X-ray lithography provided with an X-ray transmitting membrane. In order to be practically useful, the X-ray transmitting membrane must satisfy various requirements including, for example, (1) resistance against irradiation with high-energy radiations such as high-energy electron beams, synchrotron radiation and the like, (2) high visible-light transmission of at least 50% to facilitate high-precision alignment of the mask, (3) good resistance against chemicals and moisture not to be damaged in the process of etching, washing and the like, and (4) smooth surface free from any defects and pinholes.

Conventionally, the X-ray transmitting membranes in the mask for X-ray lithography are made from a material such as boron nitride BN, silicon nitride $Si_3N_4$, silicon carbide SiC and the like. Each of these conventional materials has its own advantages and disadvantages and none of them can satisfy all of the above mentioned various requirements for the material at a time. For example, membranes of boron nitride have excellent visible-light transmission but are relatively poor in the resistance against high-energy radiations and chemicals. Silicon nitride is also poor in the resistance against chemicals and moisture. Membranes of silicon carbide usually have a low visible-light transmission.

SUMMARY OF THE INVENTION

The present invention accordingly has an object to provide a novel membrane suitable for use as an X-ray transmitting membrane in a mask for X-ray lithography free from the above described problems and disadvantages in the membranes of the prior art as being imparted with a high visible-light transmission and excellent resistance against high-energy radiations and chemicals as well as a method for the preparation of such a membrane.

Thus, the novel membrane provided by the present invention is a homogeneous membrane compositely consisting of silicon carbide SiC and silicon nitride $Si_3N_4$ in a molar ratio in the range from 95:5 to 30:70.

When the above defined membrane is used as an X-ray transmitting membrane in a mask for X-ray lithography, it is preferable that the tensile stress in the membrane is in the range from $1 \times 10^8$ to $1 \times 10^{10}$ $dyn/cm^2$.

The above defined X-ray-transmitting membrane of the invention can be prepared by the sputtering deposition on the surface of a substrate such as a silicon wafer using a target material compositely consisting of silicon carbide and silicon nitride in the same molar ratio as in the desired composite membrane followed by removal of the substrate by etching.

DETAILED DESCRIPTION OF THE PREFERRED EMBODIMENTS

As is described above, the X-ray transmitting homogeneous membrane of the present invention compositely consists of silicon carbide and silicon nitride in a specified molar proportion. This unique homogeneous composition of the membrane has been established on the base of the quite unexpected discovery by the inventors that a binary composite membrane homogeneously consisting of silicon carbide and silicon nitride exhibits very excellent performance not expected from the performance of any membranes formed from a single component of either silicon carbide alone or silicon nitride alone nor a laminarly composite membrane of these components presumably due to the synergistic effect of the two constituents.

Namely, the binary homogeneous membrane of the invention compositely consists of silicon carbide and silicon nitride in a molar ratio in the range from 95:5 to 30:70 or, preferably, from 80:20 to 40:60. When the molar proportion of silicon carbide is too large, the visible-light transmission of the membrane is decreased to reach the value of the membrane formed from silicon carbide alone. When the molar proportion of silicon nitride is too large, on the other hand, the composite membrane would have decreased resistance against chemicals reaching that of a membrane formed from silicon nitride alone. It is of course essential that the two constituents, i.e. silicon carbide and silicon nitride, form a homogeneous single phase in order that the membrane is highly transmitting to visible light.

It is preferable that, when the membrane is used as an X-ray-transmitting membrane of a mask for X-ray lithography, the membrane is under a tensile stress within the membrane in the range from $1 \times 10^8$ to $1 \times 10^{10}$ $dyn/cm^2$ or, more preferably, in the range from $5 \times 10^8$ to $5 \times 10^9$ $dyn/cm^2$. When the tensile stress within the membrane is too small, the membrane is liable to be wrinkled. When the tensile stress is too large, on the other hand, the membrane is at risk of destruction by some chance.

As is mentioned before, the above described membrane of the invention can be prepared utilizing the method of sputtering. The conditions of the sputtering process can be conventional and are not particularly limitative but it is preferable to undertake the socalled magnetron sputtering method in respect of the relatively large velocity of film deposition to contribute to the improvement in the mass-productivity. The atmospheric gas for sputtering is preferably argon or xenon in respect of the chemical inertness and stability of the sputerring process although a small volume of helium, nitrogen and the like can be contained in the atmospheric gas. The gaseous pressure of the sputtering atmosphere is preferably in the range from 0.01 to 0.1 Torr or, more preferably, from 0.04 to 0.08 Torr though not particularly limitative thereto. It should be noted that this limitation in the gaseous pressure of the sputtering atmosphere is important since the pressure has a great influence on the tensile stress in the sputtering-deposited film on the substrate surface. Therefore, the pressure should be selected in consideration of the composition of the target material so as to obtain the desired tensile stress in the membrane.

The substrate on which the SiC-Si$_3$N$_4$ film is deposited by sputtering is usually a semiconductor silicon wafer. The substrate during sputtering is kept at a temperature in the range from 100° to 1000° C. or, preferably, from 150° to 1000° C. When the temperature of the substrate is outside of this range, the resultant sputtering-deposited film eventually has certain defects or pinholes. The electric power impressed to the target should be at least 5 watts/cm$^2$ or, preferably, in the range from 5 to 30 watts/cm$^2$ in respect of the tensile stress in the sputtering-deposited film. The velocity of deposition of the film can be increased by increasing the input power to the target.

The target used in the above described sputtering process is a uniform composite material of silicon carbide and silicon nitride. Since no selective deposition of either the silicon carbide or silicon nitride takes place, the molar proportion of the silicon carbide and silicon nitride in the target should be the same as in the desired film to be deposited by sputtering. Namely, the molar proportion of silicon carbide to silicon nitride in the target is in the range from 95:5 to 30:70 or, preferably, from 80:20 to 40:60 for the same reasons mentioned before in connection with the composition in the membrane. In particular, it is noted that the velocity of the sputtering-deposition of the film is the largest when the molar proportion of the siliocn carbide and silicon nitride in the target is around 50:50. The sputtering target can be prepared by intimately mixing powders of silicon carbide and silicon nitride and sintering the powder mixture in a hot press. The powders of starting silicon carbide and silicon nitride each should have a purity as high as possible or, for example, at least 99% or, desirably, at least 99.9%.

In the following, the present invention is described in more detail by way of examples and comparative examples which, however, should never be construed to limit the scope of the invention in any way. The sputtering-deposited films obtained in the experiments were evaluated by measuring various properties in the respective methods described below.

[1] Velocity of film deposition

Sputtering deposition was performed under the same conditions as in each of the experiments in the Examples and Comparative Examples described below on a silicon wafer as the substrate covered partly with a mask of a stainless steel plate for 10 to 15 minutes and the thickness of the deposited film was determined by measuring the level difference between the areas having and not having the thus deposited film by removing the mask using a Surfcoder Model SE-30C (manufactured by Kosaka Kenkyuusho) to calculate the velocity of deposition.

[2] Tensile stress within film

Warping of a silicon wafer substrate was measured before and after the sputtering deposition of the SiC-Si$_3$N$_4$ film and the tensile stress was calculated from the increment in the warping of the wafer. This method is described in Solid State Technology, 1984 (9), pages 192 to 199, and well known in the art.

[3] Visible-light transmission

Sputtering deposition was performed under the same conditions as in each of the Examples and Comparative Examples described below on a plate of fused quartz glass (3WAF 525, a product by Shin-Etsu Chemical Co.) and the light transmission of the quartz glass plate having the SiC-Si$_3$N$_4$ film deposited thereon was measured at a wavelength of 633 nm by using a multi-photospectrometer (Model MPS-5000 manufactured by Shimadzu Seisakusho) using a fresh quartz glass plate as the reference.

[4] Resistance against high-energy beam irradiation

The SiC-Si$_3$N$_4$ film deposited on the surface of a silicon wafer as the substrate was irradiated with electron beams of 10 keV energy in a dose of 500 MJ/cm$^2$ and the decrement of the tensile stress in the film was determined and recorded in % as a measure of the resistance against high-energy beam irradiation.

[5] Resistance against chemicals

A silicon wafer having a sputtering-deposited SiC-Si$_3$N$_4$ film thereon was provided on the other surface and the periphery with an alkali-resistant coating of amorphous boron nitride, referred to as a-BN hereinbelow, in a thickness of 1.0 $\mu$m by the plasma-CVD method and immersed for 24 hours in a 30% by weight aque-ous solution of potassium hydroxide kept at 90° C. and the decre-ment of the tensile stress in the film was determined and recorded in % as a measure of the resistance against chemicals.

[6] Moisture resistance

A silicon wafer having a sputtering-deposited SiC-Si$_3$N$_4$ film thereon was immersed for 7 days in hot water kept at 90° C. and the decrement of the tensile stress in the film on the substrate was determined and recorded in % as a measure of the resistance against moisture.

[7] Membrane-formability

The silicon wafer having the sputtering-deposited SiC-Si$_3$N$_4$ film on one surface was subjected to a plasma-CVD process to be coated on the other surface with a film of a-BN having a thickness of 1.0 $\mu$m. An annular mask of stainless steel was mounted on the a-BN-coated surface of the silicon wafer and the a-BN film in the exposed area was removed by dry etching with carbon tetrafluoride gas as an etchant. Thereafter, the silicon substrate was removed away by wet etching with a 30% aqueous solution of potassium hydroxide leaving the annular portion protected by the film of a-BN so that the SiC-Si$_3$N$_4$ membrane was obtained as supported by the annular frame of the silicon. The membrane-formability was found to be good when the thus prepared membrane had a smooth surface without any defects or pinholes.

Examples (Experiments No. 1 to No. 18) and Comparative Examples (Experiments No. 19 to No. 23).

The experimental conditions in Experiment No. 1 were as follows. Thus, a sintered target consisting of silicon carbide and silicon nitride in a molar ratio of 95:5 and having a diameter of 3 inches and a thickness of 5 mm was set on the cathode of a highfrequency magnetron sputtering apparatus for batch-wise testing (Model SPF-332 manufactured by Nichiden Anerva Co.). A silicon wafer of 3-inch diameter having a thickness of 600 $\mu$m was set in the apparatus as a substrate and kept at 200° C. Sputtering on the substrate surface was conducted under impression of an electric power of 10 watts/cm$^2$ while keeping the pressure inside the apparatus at 0.06 Torr by passing argon gas at a flow rate of 7 ml/minute for a length of time sufficient to give a sputtering-deposited film having a thickness of 1.0 $\mu$m. The velocity of film deposition by sputtering was 0.09 μm/minute. The thus formed film was analyzed for the contents of the elements by the ESCA method to find that the contents of silicon, nitrogen and carbon were 68.1%, 6.2% and 25.7%, respectively. The contents of carbon and nitrogen corresponded approximately to an $SiC:Si_3N_4$ molar ratio of 95:5.

The experimental procedure in each of the other experiments was substantially the same as above excepting modifications in the composition of the $SiC-Si_3N_4$ target, density of power input, substrate temperature and the pressure of the sputtering atmosphere as shown in Table 1 below, which also shows the velocity of film deposition by sputtering in each of the experiments.

The $SiC-Si_3N_4$ films deposited on the silicon wafer substrate were each subjected to the evaluation tests for the above given items to give the results mentioned below and shown in Table 1. The decrement in the tensile stress as a measure of the resistance against high-energy beam irradiation was always smaller than 1% in each of the experiments. The decrement in the tensile stress as a measure of the resistance against chemicals was always smaller than 1% in each of the experiments excepting Experiments No. 16 to No. 18 and No. 21 to No. 23, in which the values were 2.0%, 3.0%, 5.0%, 15%, 28 % and 40%, respectively. Further, the decrement in the tensile stress as a measure of the moisture resistance was always smaller than 1% in each of the experiments excepting Experiments No. 16 to No. 18, and No. 21 to No. 23, in which the values were 3.0%, 5.0%, 8.0%, 35%, 48% and 65%, respectively. The membrane-formability of the sputtering-deposited films was satisfactory in each of the experiments

TABLE 1

|  | Experiment No. | | | | |
| --- | --- | --- | --- | --- | --- |
|  | 1 | 2 | 3 | 4 | 5 |
| $SiC:Si_3N_4$ molar ratio in target | 95:5 | 85:15 | 70:30 | 70:30 | 70:30 |
| Power density, watts/cm$^2$ | 10 | 10 | 10 | 7 | 15 |
| Substrate temperature, °C. | 200 | 200 | 200 | 200 | 200 |
| Sputtering pressure, Torr | 0.06 | 0.06 | 0.06 | 0.06 | 0.06 |
| Velocity of film deposition, μm/minute | 0.09 | 0.10 | 0.13 | 0.10 | 0.16 |
| Tensile stress, × 10$^9$ dyn/cm$^2$ | 2.6 | 2.4 | 2.3 | 2.5 | 2.1 |
| Visible light transmission, % | 52 | 58 | 64 | 64 | 65 |

TABLE 1-continued

|  | Experiment No. | | | | |
| --- | --- | --- | --- | --- | --- |
|  | 6 | 7 | 8 | 9 | 10 |
| $SiC:Si_3N_4$ molar ratio in target | 70:30 | 70:30 | 70:30 | 70:30 | 60:40 |
| Power density, watts/cm$^2$ | 10 | 10 | 10 | 10 | 10 |
| Substrate temperature, °C. | 150 | 300 | 200 | 200 | 200 |
| Sputtering pressure, Torr | 0.06 | 0.06 | 0.04 | 0.08 | 0.06 |
| Velocity of film deposition, μm/minute | 0.12 | 0.14 | 0.14 | 0.15 | 0.14 |
| Tensile stress, × 10$^9$ dyn/cm$^2$ | 2.2 | 2.0 | 0.4 | 0.7 | 2.1 |
| Visible light transmission, % | 65 | 65 | 65 | 65 | 72 |

|  | Experiment No. | | | | |
| --- | --- | --- | --- | --- | --- |
|  | 11 | 12 | 13 | 14 | 15 |
| $SiC:Si_3N_4$ molar ratio in target | 50:50 | 50:50 | 50:50 | 50:50 | 50:50 |
| Power density, watts/cm$^2$ | 10 | 10 | 10 | 10 | 15 |
| Substrate temperature, °C. | 200 | 150 | 300 | 200 | 200 |
| Sputtering pressure, Torr | 0.06 | 0.06 | 0.06 | 0.04 | 0.08 |
| Velocity of film deposition, μm/minute | 0.15 | 0.15 | 0.16 | 0.15 | 0.17 |
| Tensile stress, × 10$^9$ dyn/cm$^2$ | 1.8 | 1.8 | 1.6 | 0.2 | 0.6 |
| Visible light transmission, % | 74 | 75 | 75 | 74 | 75 |

|  | Experiment No. | | | | |
| --- | --- | --- | --- | --- | --- |
|  | 16 | 17 | 18 | 19 | 20 |
| $SiC:Si_3N_4$ molar ratio in target | 40:60 | 35:65 | 30:70 | 97:3 | 100:0 |
| Power density, watts/cm$^2$ | 10 | 10 | 10 | 10 | 10 |
| Substrate temperature, °C. | 200 | 200 | 200 | 200 | 200 |
| Sputtering pressure, Torr | 0.06 | 0.06 | 0.06 | 0.06 | 0.06 |
| Velocity of film deposition, μm/minute | 0.13 | 0.12 | 0.11 | 0.08 | 0.08 |
| Tensile stress, × 10$^9$ dyn/cm$^2$ | 1.8 | 1.9 | 2.0 | 3.0 | 3.5 |
| Visible light transmission, % | 73 | 72 | 72 | 29 | 24 |

|  | Experiment No. | | |
| --- | --- | --- | --- |
|  | 21 | 22 | 23 |
| $SiC:Si_3N_4$ molar ratio in target | 20:80 | 10:90 | 0:100 |
| Power density, watts/cm$^2$ | 10 | 10 | 10 |
| Substrate temperature, °C. | 200 | 200 | 200 |
| Sputtering pressure, Torr | 0.06 | 0.06 | 0.06 |
| Velocity of film deposition, μm/minute | 0.10 | 0.10 | 0.09 |
| Tensile stress, × 10$^9$ dyn/cm$^2$ | 2.4 | 2.7 | 2.9 |
| Visible light transmission, % | 66 | 64 | 64 |

What is claimed is:

1. A membrane composite consisting of a homogenous single phase of silicon carbide and silicon nitride in a molar ratio in the range from 95:5 to 30:70.

* * * * *